(12) United States Patent
Yamazaki et al.

(10) Patent No.: US 12,109,734 B2
(45) Date of Patent: Oct. 8, 2024

(54) MANUFACTURING OF IMPRINT MOLD-FORMING SUBSTRATE

(71) Applicant: Shin-Etsu Chemical Co., Ltd., Tokyo (JP)

(72) Inventors: Hiroyuki Yamazaki, Joetsu (JP); Daiyu Okafuji, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 159 days.

(21) Appl. No.: 17/030,813

(22) Filed: Sep. 24, 2020

(65) Prior Publication Data

US 2022/0088832 A1   Mar. 24, 2022

(51) Int. Cl.
  *B29C 33/38*  (2006.01)
  *G03F 7/00*  (2006.01)
  *H01L 21/027*  (2006.01)

(52) U.S. Cl.
  CPC ........ B29C 33/3842 (2013.01); G03F 7/0002 (2013.01); H01L 21/0271 (2013.01)

(58) Field of Classification Search
  CPC ........... B29C 33/3842; B29C 2033/385; G03F 7/0002; H01L 21/0271
  See application file for complete search history.

(56) References Cited

U.S. PATENT DOCUMENTS

| | | | |
|---|---|---|---|
| 9,884,448 B2 * | 2/2018 | Okafuji | B24B 9/065 |
| 2007/0170617 A1 * | 7/2007 | Choi | B82Y 10/00 |
| | | | 264/293 |
| 2014/0210134 A1 * | 7/2014 | Wakamatsu | B82Y 40/00 |
| | | | 264/293 |

FOREIGN PATENT DOCUMENTS

| | | | | |
|---|---|---|---|---|
| JP | 2011-245787 A | 12/2011 | | |
| JP | 2015-214449 A | 12/2015 | | |
| WO | WO-03031137 A1 * | 4/2003 | | B29C 33/3814 |

* cited by examiner

*Primary Examiner* — George R Koch
*Assistant Examiner* — Jimmy R Smith, Jr.
(74) *Attorney, Agent, or Firm* — WHDA, LLP

(57) ABSTRACT

An imprint mold-forming substrate is manufactured by providing a starting imprint mold-forming substrate (1) having a patterned portion (2) and a non-patterned portion (5), providing a table (3) having a recess (4), bonding the substrate (1) to the table (3) such that the patterned portion (2) is received in the recess (4) of the table to define a space region (7) between the patterned portion (2) and the table (3) such that the patterned portion is not in direct contact with the table, and performing contour machining on the substrate (1) secured to the table (3).

7 Claims, 6 Drawing Sheets

MANUFACTURING OF IMPRINT MOLD-FORMING SUBSTRATE

TECHNICAL FIELD

This invention relates to a method for manufacturing an imprint mold-forming substrate.

BACKGROUND ART

The imprint technology is one of recent advanced technical substitutes for the photolithography. Molds used in the imprint technology are formed from substrates of various shapes. Often substrates are machined on their front surface, back surface, side surface and chamfer.

In the imprint technology, a mold is obtained by imprinting a concave/convex pattern of micrometer or nanometer size on the surface of a substrate. The mold is pressed to a recipient or a resin layer coated on a surface thereof for thereby transferring the fine pattern precisely at a time. Particularly when the UV nanoimprint process is utilized in the IC application where fine patterns are necessary, molds of synthetic quartz glass are advantageous because of low thermal expansion, purity, heat resistance and chemical resistance.

The imprint process has advantages such as cost reduction due to reduction of steps and high transfer reproducibility as compared with prior art processes. However, since the imprint technology is based on 1:1 direct contact between mold and recipient, there are inherent problems, which are not found in the conventional photolithography, such as various defects and the requirement of high topological accuracy over the entire mold.

The imprint mold preparing process involves engraving of a concave/convex pattern, which is often carried out by photolithography using a semiconductor device fabrication apparatus or equivalent and wet etching. The pattern alignment accuracy required for the semiconductor device fabrication is of the order of several hundred to several nanometers. Not only the processing accuracy of fine pattern is required, but also profiles of high accuracy covering from front and back surfaces to side surfaces of a mold are prescribed.

For example, Patent Document 1 describes a method for forming anon-through cavity in a surface of a substrate opposed to a mold pattern. During machining in Z-axis direction for non-through cavity formation, a non-through cavity corresponding to only a portion of the desired shape is formed such that the locus of a rotary machining tool passes the opposite surface where no pattern is formed. Next, the material is machined from the non-through cavity in XY direction to expand the non-through cavity to the desired shape. When the locus of the rotary machining tool passes the pattern facing surface, the vector of machining stress is directed to XY direction to mitigate the damage to the pattern.

Patent Document 2 discloses a patterned portion protecting technique for protecting to the patterned portion of a mold from damages by machining chips discharged during shape processing of the mold.

CITATION LIST

Patent Document 1: JP-A 2011-245787
Patent Document 2: JP-A 2015-214449

SUMMARY OF INVENTION

In Patent Document 1, however, the stress during machining in Z-axis direction is applied over the entire surface including the pattern. The stress applied to the patterned portion during machining in XY direction is not reduced to zero. Since the patterned portion is secured by direct bonding, damages caused by bonding and damages caused by machining stresses are not avoidable.

Also in Patent Document 2, although contact with foreign particles from the exterior like machining chips is mitigated, the machining stress via the protective member is not fully reduced, and damages are not avoidable.

An object of the invention is to provide a method for manufacturing an imprint mold-forming substrate which is successful in significantly reducing the machining stress to a patterned portion without the need for extra steps and costs.

The inventors have found that when a table is provided with a recess in which a patterned portion of an imprint mold-forming substrate is received, contour machining of the substrate can be performed while maintaining the non-contact state between the patterned portion and the table.

In one aspect, the invention provides a method for manufacturing a contour-machined imprint mold-forming substrate by performing contour machining on an imprint mold-forming substrate having a patterned portion and a non-patterned portion using a machining table, wherein the table is provided with a recess in which the patterned portion of the imprint mold-forming substrate is received, the imprint mold-forming substrate at its non-patterned portion is bonded to the table to define a space region between the patterned portion and the table such that the patterned portion is not in direct contact with the table, for thereby securing the imprint mold-forming substrate to the table, and contour machining is performed on at least a portion of the imprint mold-forming substrate.

Since a space region is defined between the patterned portion of the imprint mold-forming substrate and the table, any damages or breakage to the patterned portion by the stress during contour machining is mitigated, which is effective for preventing generation of micro-defects in or deposition of foreign particles on the patterned portion.

The spaced-apart distance between the patterned portion and the table in the space region is not particularly limited as long as the patterned portion and the table do not come in direct contact. It is preferred from the aspects of operation and process stability that the distance in XY direction be at least 100 μm, more preferably at least 1 mm. The upper limit, though not critical, is preferably up to 10 mm, more preferably up to 5 mm. It is also preferred from the same aspects that the distance in Z direction be at least 10 μm, more preferably at least 50 μm.

To avoid any contact between the patterned portion and the table during attachment and detachment of the table before and after the contour machining, the table is preferably provided with a movable piece separate from, but adjacent to the recess, the movable piece being detachable from the table. When the movable piece is removed, the recess forms a continuous channel extending to the side surface of the table. Then the imprint mold-forming substrate is slidably detached from the table past its side surface.

Advantageous Effects of Invention

Since any damage to the patterned portion by the machining stress during contour machining and the contact holding is avoided, a contour-machined imprint mold-forming substrate of quality is obtained.

DESCRIPTION OF PREFERRED EMBODIMENTS

Figure 1:
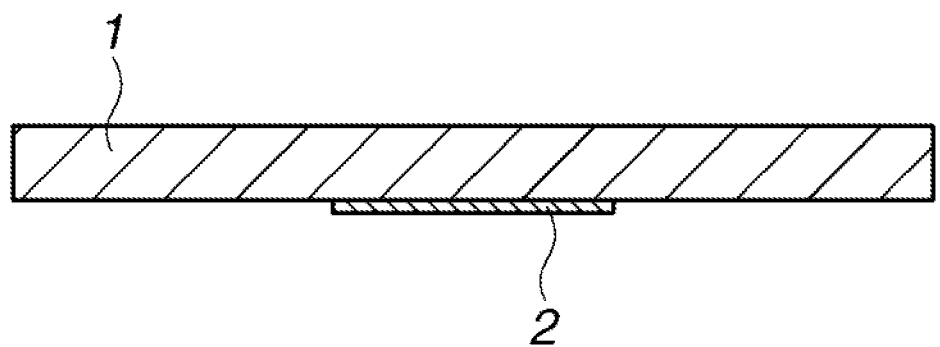
FIG. 1 is a cross-sectional view of a starting imprint mold-forming substrate used in one embodiment of the invention.

In the following description, like reference characters designate like or corresponding parts throughout the several views shown in the figures. It is understood that terms such as "front," "back," and the like are words of convenience and are not to be construed as limiting terms. The shape such as rectangular or circular shape refers to a geometric shape as viewed in plan view, typically of FIGS. 2A and 5, unless otherwise stated.

FIG. 1 is a cross-sectional view of one exemplary (starting) mold-forming substrate 1 of rectangular shape used in one embodiment of the invention, the substrate 1 having a patterned portion or mesa 2 wherein a pattern consisting of microscopic protrusions and depressions (not shown) is formed on its surface and a non-patterned portion (5 in FIG. 3) on a front surface.

A blank substrate for the mold-forming substrate 1 is prepared by molding synthetic quartz glass into a desired shape, annealing, slicing the glass to a desired thickness, grinding sliced surfaces, optionally polishing the outer periphery, rough polishing and precision polishing. Once the blank substrate thus prepared is cleaned, a film of a metal such as Cr, Cu, Mo or Ni, metal oxide or metal nitride is deposited on the substrate by a standard method such as evaporation or sputtering. The film thus deposited preferably has a thickness of up to 200 nm, more preferably 10 to 50 nm.

Next a photoresist is applied onto the metal, metal oxide or metal nitride film on the blank substrate. The photoresist may be either of positive or negative tone. Preferably positive tone resist is used from accuracy and environmental considerations. The resist is selected from resist materials for EB, EUV, ArF, KrF, i-line, and g-line lithography, depending on a particular exposure wavelength. The thickness of the resist film is generally selected in the range from several nanometers to several tens of microns. The application method may be selected from spin coating, spray coating, slit coating, and the like although spin coating is recommended because of uniform coating possibility.

On use of an exposure tool, a photomask having a desired pattern and alignment mark is furnished. In the case of direct writing, data of a desired pattern are programmed.

On use of the exposure tool, the blank substrate having the metal, metal oxide or metal nitride film and the resist film deposited thereon is set on the exposure tool whereupon the resist film is exposed through the pattern of the photomask. The photomask used herein is of greater size than the blank substrate so that the overall area subject to exposure may be covered. Although the size of the photomask and the blank substrate is not particularly limited, a choice is preferably made from 5-7 inch squares and 9 inch squares according to the SEMI standards.

In the case of direct writing, EB or laser beam is directly irradiated to the blank substrate having the metal, metal oxide or metal nitride film and the resist film deposited thereon just at the desired pattern sites, thereby forming a pattern.

After exposure is made in a dose corresponding to the type and thickness of the resist film, the resist film is developed in a developer, rinsed with deionized water, and dried.

Thereafter, the metal, metal oxide or metal nitride film is etched, for example, by wet etching with chromium etchant, acidic aqueous solution or alkaline aqueous solution, or dry etching with chlorine or fluorine based gas. There is obtained the desired metal, metal oxide or metal nitride pattern. The blank substrate is etched through this pattern, obtaining the (starting) imprint mold-forming substrate 1 having the patterned portion 2 as shown in FIG. 1.

The imprint mold-forming substrate may be etched either by wet etching procedure of dipping the substrate in an aqueous etchant solution containing hydrofluoric acid or sodium fluoride or dry etching procedure of etching with a high frequency activated plasma of fluorine base gas. In either procedure, the glass is etched so as to leave the patterned portion 2 of metal, metal oxide or metal nitride. This results in the structure that the patterned portion 2 of metal, metal oxide or metal nitride becomes a mesa as shown in FIG. 1.

The next step is to perform contour machining on at least a portion of the (starting) imprint mold-forming substrate 1 thus prepared. The contour machining step is to machine the contour or outer shape into the desired shape for the purpose of forming the shape of high accuracy required for imprint mold-forming substrates. Specifically, contour machining may be performed on at least a portion of the starting substrate, specifically one or more of front surface, back surface, side surface and chamfer of the substrate.

Since the patterned portion 2 of the starting imprint mold-forming substrate 1 must be protected during the contour machining, a protective film is preferably provided for protecting the patterned portion 2. The protective film may be a film of a metal such as Cr, Cu, Mo or Ni, or metal oxide or nitride, or a photoresist film of organic compound.

Figure 2A:
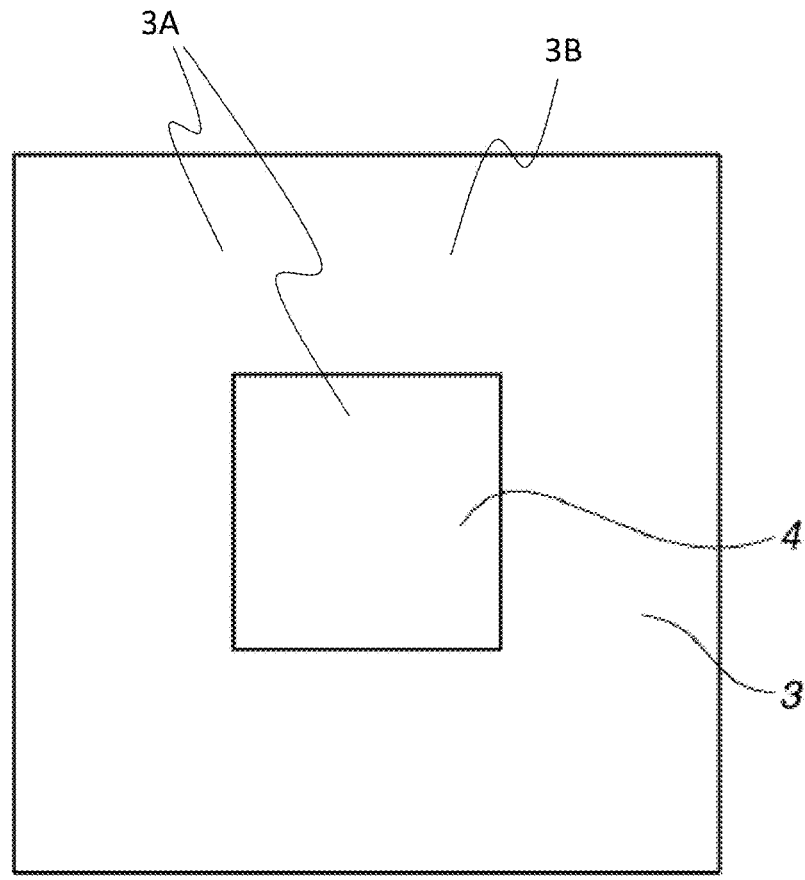
FIG. 2A and FIG. 2B illustrate a substrate machining table used in one embodiment of the invention, FIG. 2A being a plan view and FIG. 2B being a cross-sectional view.
Figure 2B:
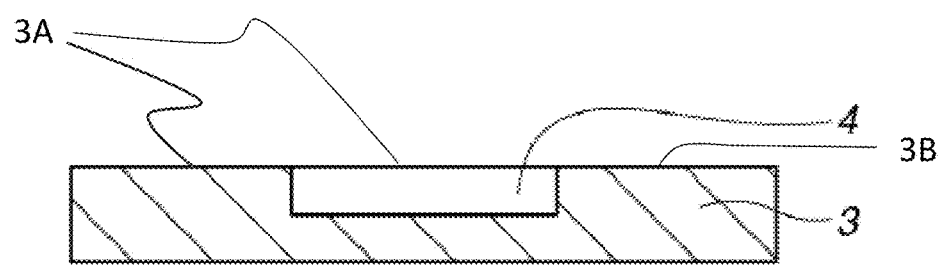

The starting imprint mold-forming substrate 1 having the patterned portion 2 protected with the protective film (not shown) is secured to a substrate machining table 3. As shown in FIG. 2A and FIG. 2B, the table 3 is provided in an approximately central area with a recess 4 of rectangular shape having a size and depth capable of receiving the patterned portion 2 of the substrate 1 in such a manner that the patterned portion 2 may not contact with the table 3. The material of which the table 3 is made may be selected from ceramic, glass and metal materials although it is not particularly limited.

It is not critical how to form the recess 4. In one example, a table blank is drilled or bored until the size of a recess becomes greater than the patterned portion 2. In another example, a table blank having a recess is molded and finished. The recess 4 may be formed by any well-known means such as machining or etching.

Figure 3:
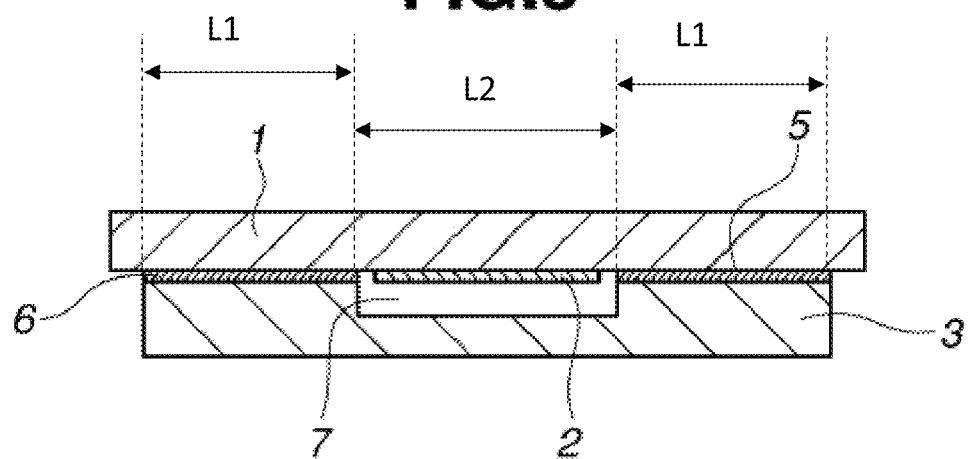
FIG. 3 is a cross-sectional view of one embodiment of the invention, illustrating the step of bonding the substrate to the table.

As shown in FIG. 3, the starting imprint mold-forming substrate 1 is bonded at its non-patterned portion 5 to the table 3 via a bonding member 6 for thereby securing the starting substrate 1 to the table 3. The bonding member 6 may be formed of a wax, epoxy or acrylic resin based adhesive or UV curable resin. The upper surface 3A includes a contact surface 3B. As shown in FIG. 2, the first area of the contact surface 3B is larger than the second area of the recess 4. As illustrated in FIG. 3, a total length L1 of the starting imprint mold-forming substrate 1 in contact with the table 3 is larger than a length L2 of the starting imprint mold-forming substrate 1 without contacting the table 3 inside the recess 4.

In the illustrated embodiment wherein the table 3 is provided with the recess 4, a space region 7 is defined between the patterned portion 2 and the table 3 when the starting substrate 1 is bonded to the table 3. Thus the patterned portion 2 is not in direct contact with the table 3. This mitigates any damages or breakage to the patterned portion 2 which is otherwise caused by the stress during subsequent contour machining, and is effective for preventing generation of micro-defects in or deposition of foreign particles on the patterned portion 2.

It is noted that the space region 7 defined between the patterned portion 2 and the table 3 is not particularly limited in size as long as the patterned portion 2 does not come in direct contact with the table 3. In consideration of operation and process stability, the spaced apart distance between the patterned portion 2 and the table 3 in the space region 7 is preferably from 100 μm to 10 mm, more preferably from 1 mm to 5 mm in XY direction, and also preferably at least 10 μm, more preferably at least 50 μm in Z direction. It is noted that XY direction is perpendicular to the plane of the paper and Z direction is upward/downward in the plane of the paper in FIG. 4.

Figure 4:
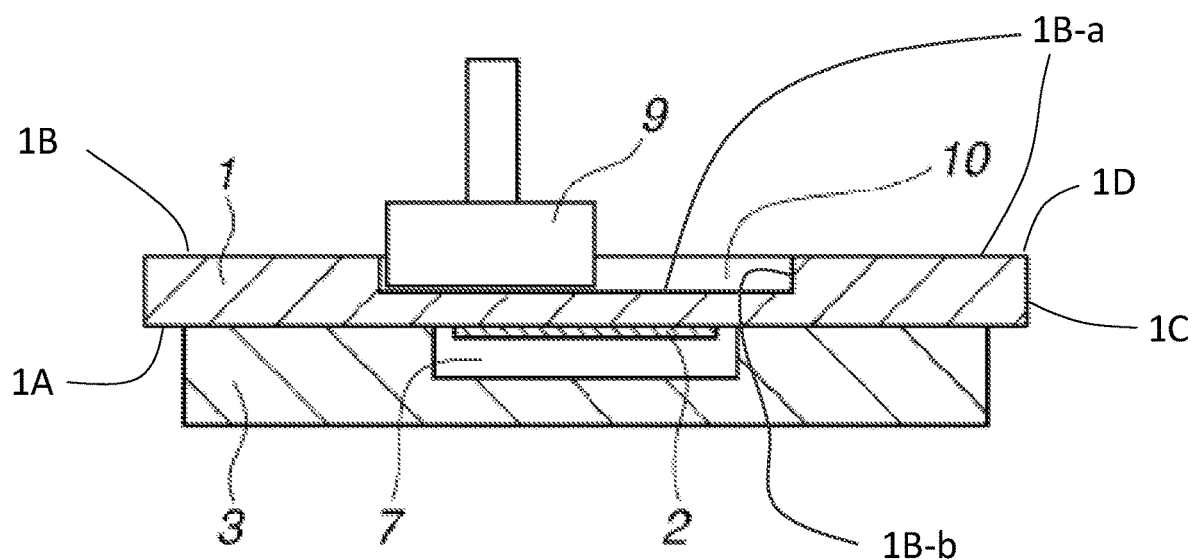
FIG. 4 is a cross-sectional view of one embodiment of the invention, illustrating the step of contour machining of the substrate at its back surface.

After the starting substrate 1 is secured to the table 3, as shown in FIG. 4, a rotary grinding wheel 9 is operated to perform contour machining on one or more of the patterned portion, front surface 1A, back surface 1B, side surface 1C and chamfer 1D of the substrate 1. The back surface 1B includes a first surface 1B-a extending horizontally, and a second surface 1B-b extending perpendicularly.

For this contour machining, an automatic machining tool such as machining center having the desired shape data programmed therein is often used. The rotary grinding wheel 9 is typically constructed as the spindle of the automatic machining tool having diamond or cubic boron nitride abrasive bonded thereto by electroplating or metal bonding (not shown). In view of machining accuracy and productivity, the spindle of the grinding wheel 9 is preferably rotated at 100 to 30,000 rpm, more preferably 1,000 to 15,000 rpm. Also in view of machining accuracy and productivity, the grinding speed is preferably 1 to 10,000 mm/min, more preferably 10 to 1,000 mm/min. During machining, preferably a cutting fluid such as emulsion, water-soluble or oily fluid is concomitantly supplied for cooling and chip removal purposes.

In FIG. 4, contour machining is performed on the back surface of the substrate 1 (opposed to the patterned portion 2) to form a bore 10. The bore 10 should not extend throughout the substrate 1 in Z direction. If the machining stress in Z direction (downward in FIG. 4) during machining of the non-through bore 10 exceeds the breaking stress of the substrate 1, the substrate 1 can be broken or cracked in the area of the space region 7 which is out of contact with the table 3. At such a risk, the machining conditions are modified so that the breaking stress may not be exceeded, by designing the shape of the grinding wheel 9 for easy chip removal, using the grinding wheel 9 of quality abrasive, or using moderate machining parameters. If the contour machining region is broader than the non-contact area including the patterned portion 2, then the contour machining is performed such that a part of the locus of the grinding wheel 9 always lies on the exact reverse side to the contact area. This mitigates the machining stress in Z direction during machining so that the breaking stress may not be exceeded.

The contour machining may include face grinding for modifying substrate size or improving the flatness of side surface, or machining of the chamfer between the front or back surface and the side surface projecting out of the table. In such machining, a rotary grinding wheel and cutting fluid as mentioned above may be used.

The thus contour-machined imprint mold-forming substrate often has non-mirror surfaces. If necessary, mirror polishing is performed on the machined area of the substrate for the purposes of strength improvement, cleanness improvement and residual stress reduction. Polishing is preferably performed with a rotary polishing pad by bringing the polishing pad in abutment to the substrate under a certain pressure, and moving one or both of the substrate and the polishing pad so as to induce relative oscillation therebetween.

Although an abrasive pre-coated pad is sometimes used, the rotary polishing pad is preferably operated while feeding an abrasive shiny. The rotary polishing pad has an effective polishing part made of expanded polyurethane, ceria-impregnated polyurethane, zirconia-impregnated polyurethane, non-woven fabric, suede, rubber, or wool felt. The material of the polishing part is not particularly limited as long as a workpiece can be polished. When the polishing is performed while feeding an abrasive slurry, the slurry is typically a water slurry of abrasive grains, preferably having a grain size of 10 nm to 10 μm, such as silica, ceria, alundum, white alundum (WA), alumina, zirconia, SiC, diamond, titania or germania. For forcing the polishing pad in abutment to the substrate under a certain pressure, a pressing mechanism such as pneumatic piston or load cell may be used.

Figure 5:
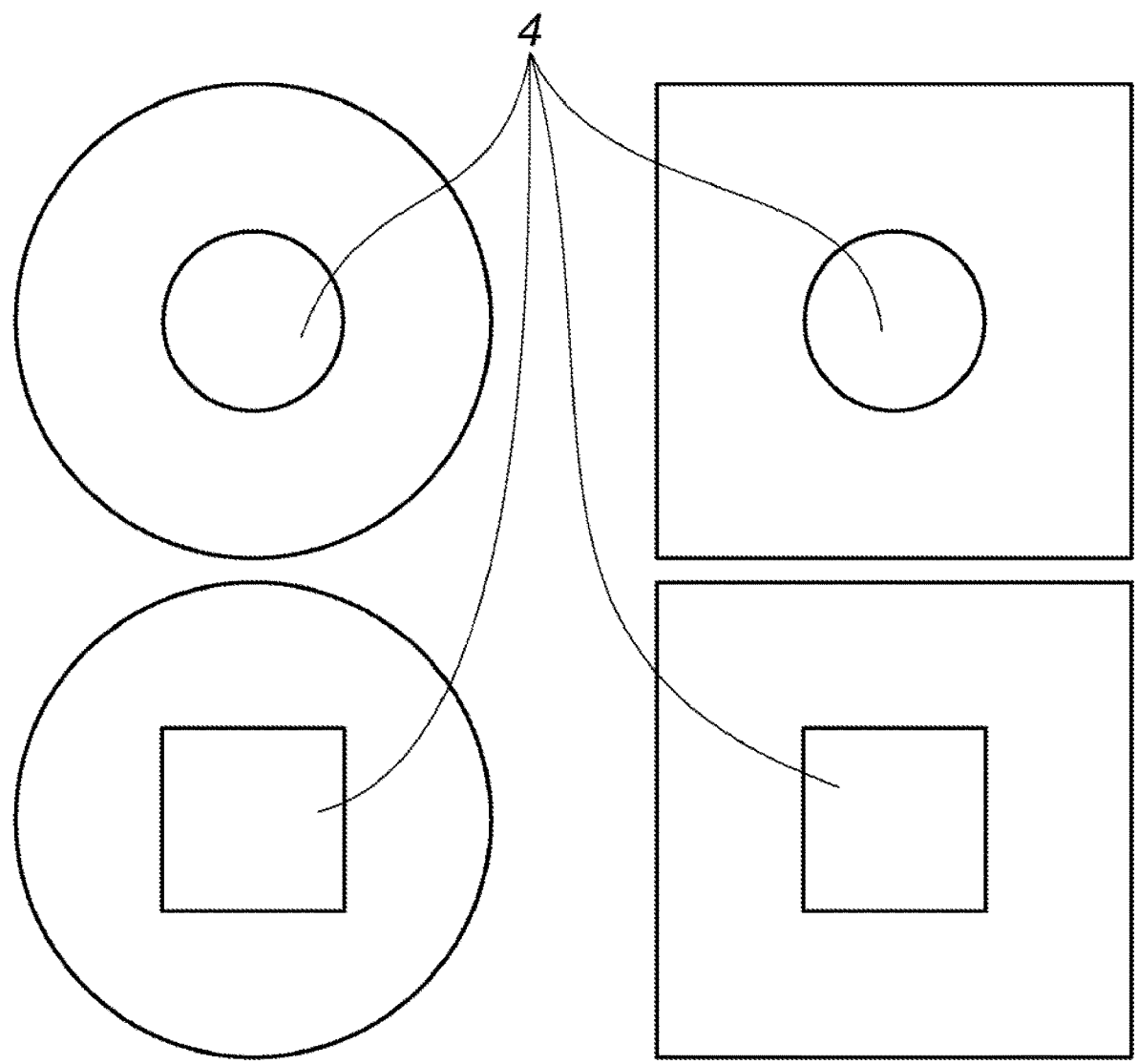
FIG. 5 is a plan view showing different examples of the recessed table.
Figure 6:
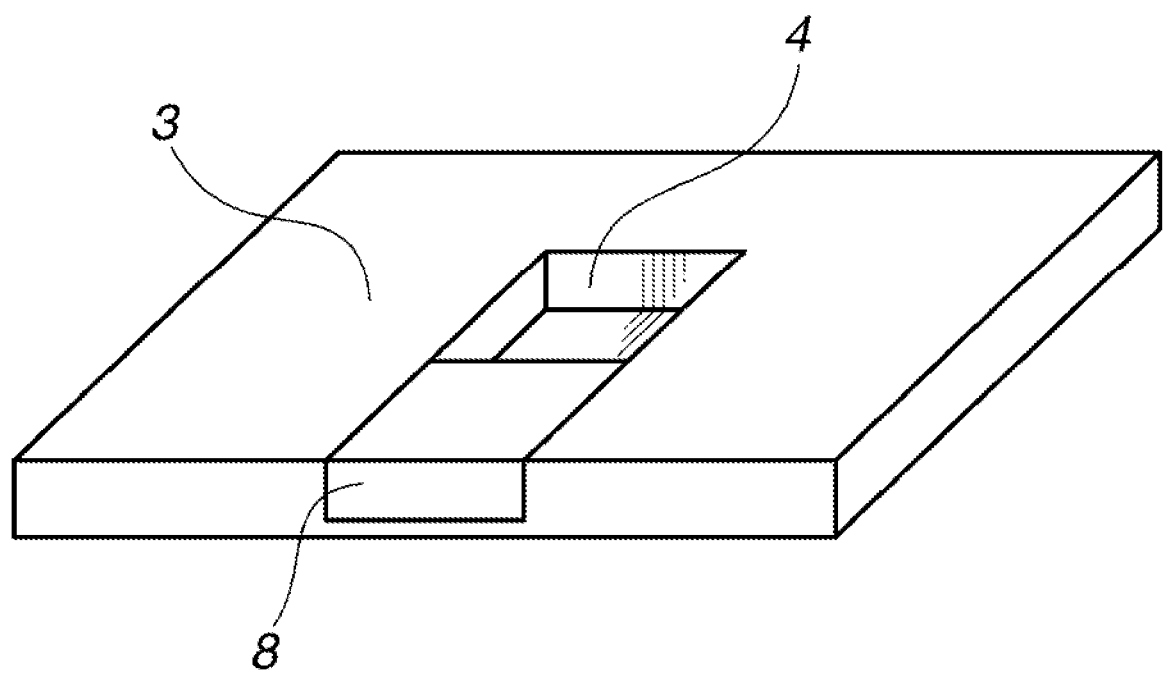
FIG. 6 is a perspective view of a table used in another embodiment of the invention.

The shape, size and other parameters of members used in the inventive method are not limited to the foregoing embodiments while various changes and modifications may be made without departing from the scope of the invention. For example, while the substrate machining table 3 of rectangular shape having the recess 4 of rectangular shape is used in the above embodiment, the table and recess are not limited to the rectangular shape. As shown in FIG. 5, any combinations of circular shape and/or rectangular shape (e.g., circular/circular, rectangular/circular, circular/rectangular, and rectangular/rectangular) are possible, depending on the shape of the imprint mold-forming substrate and the patterned portion thereon. A member of another shape may be employed if necessary.

To avoid any contact between the patterned portion and the table during attachment and detachment of the table before and after the contour machining, the table 3 is preferably provided with a movable piece 8 separate from, but adjacent to the recess 4, the movable piece 8 being detachable from the table 3. When the movable piece 8 is removed, the recess 4 forms a continuous (concave) channel extending to the side surface of the table 3. This construction allows the imprint mold-forming substrate to be slidably detached from the table 3 across its side surface.

EXAMPLES

Examples of the invention are given below by way of illustration, but not by way of limitation.

Example 1

There were furnished a synthetic quartz glass substrate of 152 mm by 152 mm by 6.35 mm (thick) having a patterned portion 2 at the central square area of 30 mm by 30 mm on a front surface as the imprint mold-forming substrate 1, and a substrate machining table 3 of 140 mm by 140 mm by 10 mm (thick) having a central recess 4 of 35 mm by 35 mm by 1 mm (deep). Using a rosin based synthetic wax as the bonding member 6, the substrate 1 at its non-patterned portion 5 was bonded to the table 3 so as to define a space region 7 between the patterned portion 2 and the table 3.

Next, using a rotary grinding wheel 9 of diameter 32 mm, contour machining was performed on the back surface of the glass substrate to form a non-through bore 10. The grinding wheel 9 was turned around with the center of the grinding wheel 9 offset 16 mm from the center of the substrate, until the non-through bore 10 of diameter 64 mm was formed. During the contour machining, the grinding wheel 9 was always kept in abutment with the side of the substrate opposed to the non-contact and contact areas between the table 3 and the substrate 1 front surface.

As a result, a non-through bore 10 having a diameter of 64 mm and a depth of ~5.5 mm was machined in the back surface of the glass substrate 1 while the remaining wall of the substrate had a thickness of ~1 mm.

After cleaning, the contour-machined substrate was inspected for micro-defects by an automatic flaw inspection system. No fracture was found on all the surfaces of the substrate including the patterned portion 2.

Comparative Example 1

The same synthetic quartz glass substrate as in Example 1 was bonded at its non-patterned portion to a flat (non-recessed) table using a rosin based synthetic wax.

The substrate was machined on the back surface and cleaned as in Example 1, after which it was inspected for micro-defects by an automatic flaw inspection system. Concave defects, caused probably by contour machining, were found over the entire patterned portion. The patterned portion was chipped away at the edge.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a nanoimprint mold-forming substrate, comprising the steps of:
   providing a starting imprint mold-forming substrate having a patterned portion and a non-patterned portion, the starting imprint mold-forming substrate comprising: a front surface, a back surface, a side surface, and optionally a chamfer, wherein the patterned portion is provided on the front surface, wherein the non-patterned portion is provided on the front surface, the back surface, the side surface and optionally the chamfer,
   providing a table having an upper surface comprising a contact surface having a first area and a recess having a second area, the recess recessed from the contact surface, the first area of the contact surface being larger than the second area of the recess,
   bonding the starting imprint mold-forming substrate at its non-patterned portion of the front surface to the table such that the patterned portion of the starting imprint mold-forming substrate is received in the recess of the table to define a space region between the patterned portion and the table such that the patterned portion is not in direct contact with the table, wherein the distance between the patterned portion and the table in the space region is at least 100 μm in a horizontal direction parallel to the upper surface of the table and at least 10 μm in a vertical direction perpendicular to the upper surface of the table,
   performing contour machining to grind at least a portion of the non-patterned portion when the starting imprint mold-forming substrate is secured to the table, and
   obtaining the nanoimprint mold-forming substrate wherein the back surface comprises a first surface extending horizontally, and optionally a second surface extending perpendicularly.

2. The method of claim 1, wherein the back surface comprises the first surface and the second surface, such that the nanoimprint mold-forming substrate comprises a non-through bore on the back surface.

3. The method of claim 1, wherein the starting imprint mold-forming substrate comprises the chamfer, wherein the non-patterned portion is provided on the front surface, the back surface, the side surface and the chamfer.

4. The method of claim 1, wherein in a cross-sectional view of the starting imprint mold-forming substrate and the table, a total length of the starting imprint mold-forming substrate in contact with the table is larger than a length of the starting imprint mold-forming substrate which does not contact the table and is inside the recess.

5. The method of claim 1, wherein the back surface consists of the first surface extending horizontally.

6. The method of claim 1, wherein the back surface consists of the first surface extending horizontally, and the second surface extending perpendicularly.

7. The method of claim 2, wherein the back surface consists of the first surface and the second surface.

* * * * *